United States Patent [19]

Jordan

[11] Patent Number: 5,574,392
[45] Date of Patent: Nov. 12, 1996

[54] ASYMMETRICAL RAMP GENERATOR SYSTEM

[75] Inventor: Edward P. Jordan, Greensboro, N.C.

[73] Assignee: Analog Devices, Inc., Norwood, Mass.

[21] Appl. No.: 428,374

[22] Filed: Apr. 25, 1995

[51] Int. Cl.⁶ .................................. H03K 3/01; H03K 4/06
[52] U.S. Cl. ...................... 327/131; 327/132; 327/134; 327/170
[58] Field of Search .................................... 327/131, 134, 327/136, 170, 172, 173, 174, 175, 176, 135, 355, 132, 140

[56] References Cited

U.S. PATENT DOCUMENTS

| | | | |
|---|---|---|---|
| 3,810,039 | 5/1974 | Fein | 327/131 |
| 4,203,074 | 5/1980 | Gass | 327/131 |
| 4,227,124 | 10/1980 | Elliott, Jr. | 327/131 |
| 4,360,747 | 11/1982 | Ryan | 327/131 |
| 4,771,193 | 9/1988 | Ohta | 327/134 |
| 4,820,940 | 4/1989 | Wachi et al. | 327/131 |
| 5,394,020 | 2/1995 | Nienaber | 327/131 |
| 5,438,291 | 8/1995 | Carbou et al. | 327/269 |
| 5,502,419 | 3/1996 | Kawasaki et al. | 327/131 |

Primary Examiner—Timothy P. Callahan
Assistant Examiner—My-Trang Nu Ton
Attorney, Agent, or Firm—Iandiorio & Teska

[57] ABSTRACT

An asymmetrical ramp generator system for a pulse width modulator includes a complementary clock circuit; a first symmetrical dual ramp generator, responsive to the clock circuit, for generating first and second ramps having a predetermined voltage range and extending for a period equal to or greater than one half the clock cycle; a comparator device, responsive to the first and second symmetrical ramps and to a reference level within the predetermined voltage range of the first and second ramps, for generating corresponding dual first and second asymmetrical drive signals; and a second asymmetrical dual ramp generator, responsive to the first and second asymmetrical drive signals, for generating third and fourth asymmetrical overlapping ramps which extend beyond the predetermined voltage range.

12 Claims, 5 Drawing Sheets

ASYMMETRICAL RAMP GENERATOR SYSTEM

FIELD OF INVENTION

This invention relates to an asymmetrical ramp generator system for a pulse width modulator.

BACKGROUND OF INVENTION

When variable width pulses are generated with voltage ramp generators and comparators, less than 100% of the voltage ramps may be utilized. This is due to the fact that the comparator must have some level of overdrive to assure a stable state. In some cases the input clock signal driving the voltage ramp is a 50% duty cycle signal; then the voltage ramp can be made to operate for 50% of the clock cycle. With two or more alternating ramps generated there is a ramp on at all times and an alternate ramp off at all times. See U.S. Pat. No. 5,317,199, issued May 31, 1994, "Ramp Generator System", by Edward Perry Jordan; U.S. Pat. No. 5,295,158, issued Mar. 15, 1994, "Dynamically Selectable Multimode Pulse Width Modulation System", by Edward Perry Jordan; and U.S. Pat. No. 5,283,515, issued Feb. 1, 1994, "Automatic Calibration System for a Ramp Voltage Generator", by Edward Perry Jordan. Using two ramps has the advantage of doubling the system speed. A digital to analog converter (DAC) can be compared against one ramp to generate a variable width output pulse. During the time one DAC and ramp are being used to generate one pulse, a new value can be loaded into the DAC associated with the off voltage ramp. Thus a series of variable width sequential pulses can be generated by alternating ramps. This approach has a problem in that two sequential full width pulses will not touch. Any pulse generated by a system such as this will not extend through the full ramp period (this is due to non ideal comparators). Two sequential full width pulses will have a gap between them.

In certain applications it is advantageous to use 100% of the ramp's period to generate pulses that extend up to 100% of the voltage ramp's period. This would require extremely fast and extremely high gain comparators to generate full width pulses. These approaches are expensive and impractical for higher volume low cost production.

SUMMARY OF INVENTION

It is therefore an object of this invention to provide an improved asymmetrical ramp generator system for a pulse width modulator.

It is a further object of this invention to provide such an improved asymmetrical ramp generator system which can generate pulses up to and beyond the full duty cycle of the input clock.

It is a further object of this invention to provide such an improved asymmetrical ramp generator system which can eliminate gaps between contiguous pulses.

It is a further object of this invention to provide such an improved asymmetrical ramp generator system which produces accurate pulses over a wide range of frequencies.

It is a further object of this invention to provide such an improved asymmetrical ramp generator system in which the first and second sets of ramps are switched in a similar manner to maintain similar switching transitions and slew rates.

It is a further object of this invention to provide such an improved asymmetrical ramp generator system which shares current between the first and second sets of ramps to adjust the slew rates of the second set of ramps with respect to the first set of ramps and shapes contiguous pulses with a gap, without a gap, or overlapping.

It is a further object of this invention to provide such an improved asymmetrical ramp generator system which is temperature independent and lends itself to automatic calibration.

It is a further object of this invention to provide such an improved asymmetrical ramp generator system which reduces the required number of frequency dependent matched current sources.

The invention results from the realization that an improved asymmetrical ramp generator system which can generate pulses up to and beyond the full duty cycle of the input clock and virtually eliminate gaps between contiguous pulses in dual ramp circuits and which is accurate over a wide range of frequencies can be effected by generating symmetrical ramps which are used to generate asymmetrical duty cycle drive signals for driving a second set of voltage ramps that slew for up to and beyond the full duty cycle of the input clock.

This invention features an asymmetrical ramp generator system for a pulse width modulator which includes a complementary clock circuit and a first symmetrical dual ramp generator, responsive to the clock circuit, for generating first and second ramps having a predetermined voltage range and extending for a period equal to or greater than one half the clock cycle. The comparator device responsive to each of the first and second symmetrical ramps and to a reference level within the predetermined voltage range of the first and second ramps generates corresponding dual first and second asymmetrical drive signals. A second asymmetrical dual ramp generator responsive to the first and second asymmetrical drive signals generates third and fourth asymmetrical overlapping ramps which extend beyond the predetermined voltage range.

In a preferred embodiment there may be a pulse width modulator responsive to the third and fourth asymmetrical overlapping ramps for generating corresponding first and second continuous pulses. The pulse width modulator may generate corresponding first and second contiguous pulses. The clock circuit may include a clock and a divide by two circuit for providing dual symmetrical complementary 50% duty cycle clock pulses. The comparator device may include first and second comparators each of which receives at one of its inputs one of the first and second symmetrical ramps and receives at the other of its inputs a reference level. The first symmetrical dual ramp generator may include first and second ramp generators, a first current source for applying a first current to set the slew rate of the active one of the first and second ramps, and a second current source for supplying a second current to set the upper level of the inactive one of the first and second ramps, and first switching means for alternately selectively interchanging the first and second current sources between the first and second ramp generators. The second asymmetrical dual ramp generator may include third and fourth ramp generators, a third current source for supplying a third current to set the slew rate of the third ramp, a fourth current source for supplying a fourth current to set the upper level of the third ramp, a fifth current source for supplying a fifth current to set the slew rate of the fourth ramp, a sixth current source for supplying a sixth current to set the upper level of the fourth ramp, and a second switching means for alternately selectively connecting the third and sixth current sources to one of the third and fourth ramp generators and the fourth and fifth current sources to the other of the third and fourth ramp generators. The first, third and fifth currents may be equal; the fourth and sixth currents may be equal, and the second, fourth and sixth currents may be equal. There may be a slew rate compensator circuit responsive to the first and second ramps exceeding the predetermined voltage range for decreasing the slew rate of the third and fourth ramps relative to the slew rate of the first and second ramps. The slew rate compensator circuit may include a current splitting circuit for controlling the ratio of the first, third and fifth currents.

DISCLOSURE OF PREFERRED EMBODIMENT

Other objects, features and advantages will occur to those skilled in the art from the following description of a preferred embodiment and the accompanying drawings, in which:

FIGS. 1A–E illustrate the waveforms occurring in a prior art dual ramp generator system for a pulse width modulator.

FIGS. 2A–H illustrate the waveforms occurring in an asymmetrical ramp generator system for a pulse width modulator according to this invention;

FIGS. 3A–E illustrate waveforms depicting ramp overshoot error correction by current sharing between the first and second ramps occurring in an asymmetrical ramp generator system for a pulse width modulator according to this invention;

Figure 1:
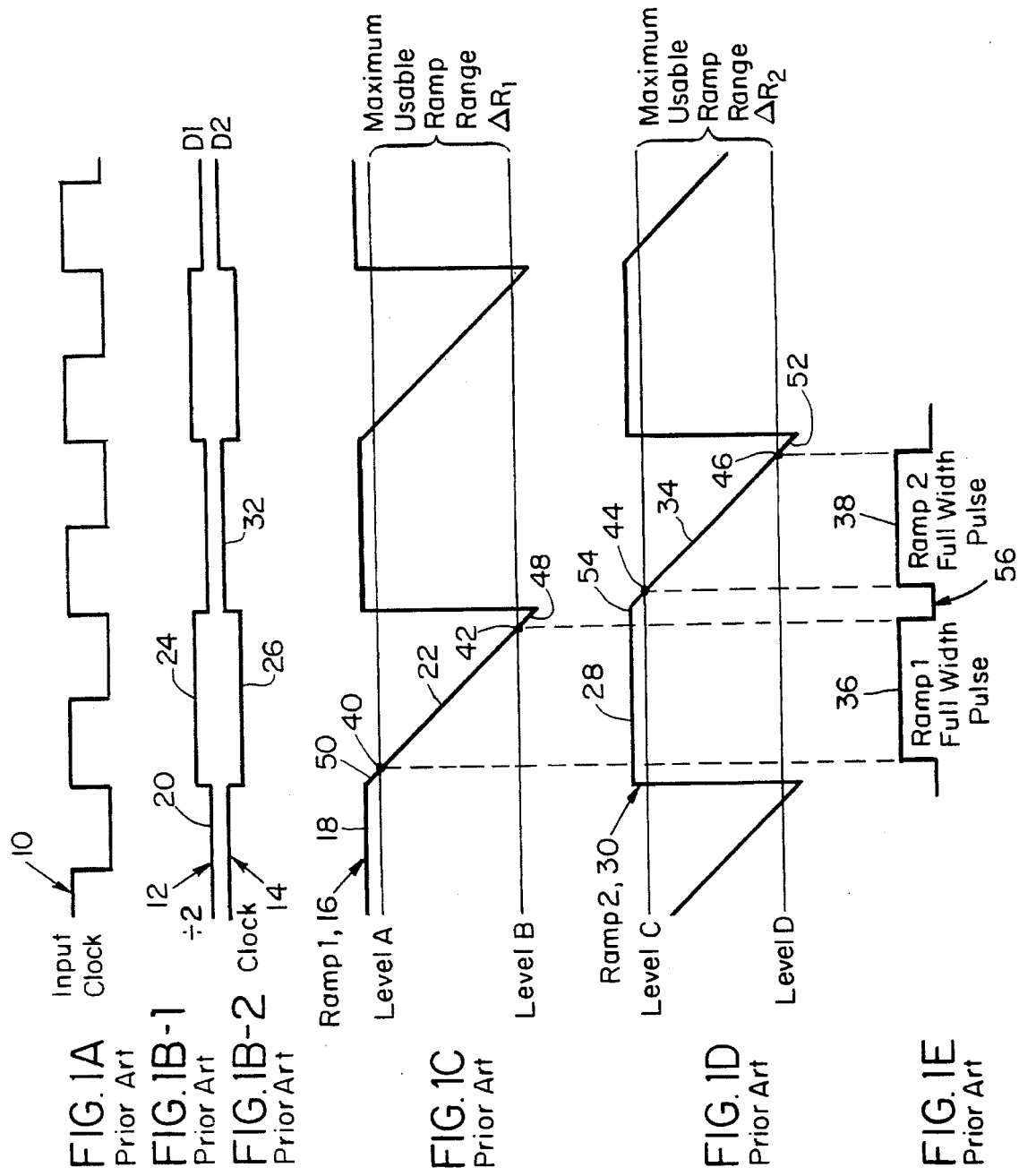

There is shown in FIG. 1A the input clock waveform 10 which when fed through a divide by two circuit provides a pair of drive signals 12, 14 (D1 and D2) which have half the frequency of the input clock 10. The input clock may be 50% duty cycle complementary signal or it may be an asymmetrical signal or it may be a noncomplementary signal. In either case the divide by two clock signal 12, 14 (D1 and D2) will, by the nature of the divide by two action, each be a 50% duty cycle complementary clock signal. Clock signal 12 is used to generate ramp 1, 16, FIG. 1C. The off time 18 corresponds to the negative portion 20 of clock signal 12 and the on time or ramp portion 22 corresponds to the positive portion 24 of clock signal 12. In a similar fashion, negative portion 26 of clock signal 14 corresponds to the off time portion 28, FIG. 1D, of ramp 2, 30, and the positive portion 32 of clock signal 14 corresponds to the on time of ramp portion 34 of ramp 2, 30. Levels A and B set the leading edge and trailing edge, respectively, of output pulse 36 in conjunction with on time ramp portion 22. Levels A and B can be provided from any source, for example a DAC, and as shown in FIG. 1C, represent the maximum and minimum levels. They can be varied to any level in between. Levels C and D perform the same function with respect to ramp 30, FIG. 1D, to generate output pulse 38. Note that the typical comparators that are used to detect the crossing points 40 and 42 as well as 44 and 46, cannot respond immediately upon the crossing but require a short period thereafter in which to respond. Thus the ramp portion 22 must extend below level B as shown at 48, and above level A as shown at 50, with respect to ramp 1, 16, and ramp portion 34 of ramp 2, 30, also has an overshoot portion 52 proximate level D and overshoot portion 54 proximate level C. The maximum usable ramp range ΔR is the distance between level A and B or level C and D when they are at their maximum and minimum points. Since ramps 22 and 34 were generated by contiguous pulses 24 and 32, and since some overlap is required as indicated at 48, 50, 52 and 54, the final output pulses 36 and 38 generated from these ramps will not be contiguous; there will be a gap 56, FIG. 1E, which in some cases may be undesirable.

Figure 2:
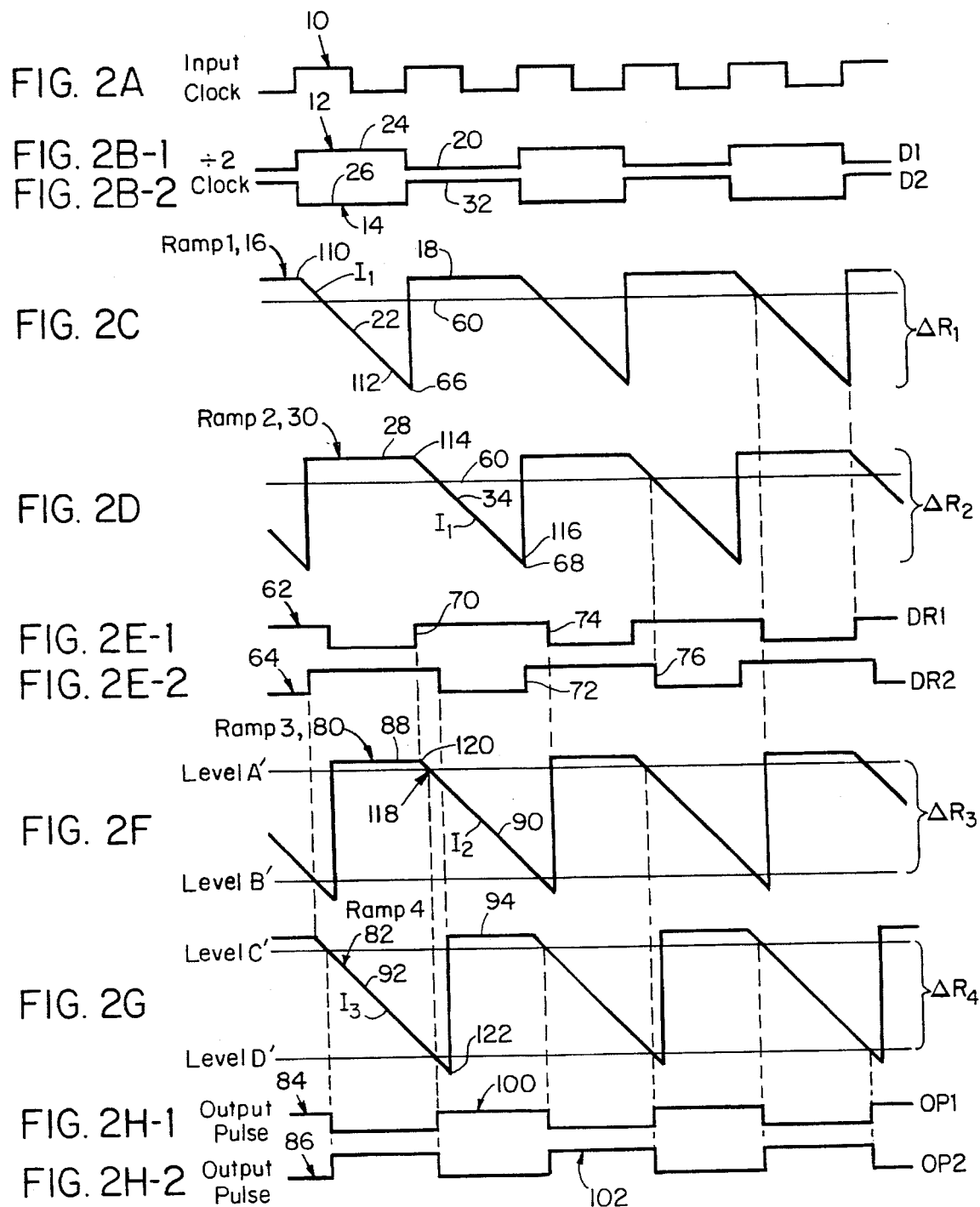

In accordance with this invention, input clock 10, FIG. 2A, is used to generate the divide by two clock signals 12 and 14, FIG. 2B. The positive portion 24 and negative portion 20 of clock signal 12 generate the on time 22 and the off time or ramp portion 18 of ramp 1, 16, and the negative portion 26 and positive portion 32 of clock signal 14 generate the off time 28 and the on time or ramp portion 34 of ramp 2, 30, FIG. 2D.

However, a reference level X 60, FIGS. 2C and 2D, is used in conjunction with ramp 1, 16, and ramp 2, 30, to generate intermediate or drive pulses DR1 and DR2, 62 and 64, FIG. 2E. The position of level X 60 determines the position of the falling edges 74 and 76 of drive signals 62 and 64.

Level X can be moved up and down through the maximum usable range ΔR1 and ΔR2 of ramps 16 and 30. When level X 60 is at the top of the range coincident with the off time 18 or 28 then the intermediate drive pulses 62 and 64 will be equal. As level X 60 moves downward from the off time 18 and 28 to the low point defined by the lowest extent of slew portions 22 and 34, for example at points 66 and 68, the pulses become larger. Thus when level 60 is at the off time levels 18 and 28, the pulses generated will have a 50% duty cycle. As level 60 moves downward to points 66 and 68 the pulses become larger and overlap more and more, and when level 60 reaches point 66, 68, the pulses will be 100% greater than the full duty cycle of input clock 10, FIG. 2A.

One advantage of this technique is that even as the pulses are increased from 100% to 200% of the full duty cycle at input clock 10, the leading edge, for example 70, 72, FIG. 2E, remains stationary while the lagging edges 74, 76 are the ones that move out in time. Thus the ramps do not have to be realigned because of an adjustment in the length of the pulses: they always start at the same time and the ramp has the same slope. Drive pulses 62 and 64 are used to generate ramps 3 and 4, 80 and 82, FIGS. 2F and 2G, in the same manner as ramps 16 and 30 were generated by divide by two clock, FIGS. 1C and 1D, were provided by divide by two clock signals 12 and 14, FIG. 1B. Now levels A' and B', similar in function to levels A and B, and levels C' and D', similar in function to levels C and D, define the maximum usable ramp range ΔR3 and ΔR4, respectively. They also define the leading and trailing edges of the final output pulses 84 and 86, FIG. 2H. Thus merely by moving level X, the relative lengths of the pulses in drive 1 and drive 2 signals 62 and 64 can be adjusted, which in turn adjusts the off time 88 and on time or ramp portion 90 of ramp 3, 80, FIG. 2F, and the on time or ramp portion 92 and off time 94 portion of ramp 82, FIG. 2G, and as shown in this specific example, the output pulses 100 and 102 can be made to be exactly contiguous without the gap occurring in the prior art devices.

Figure 5:
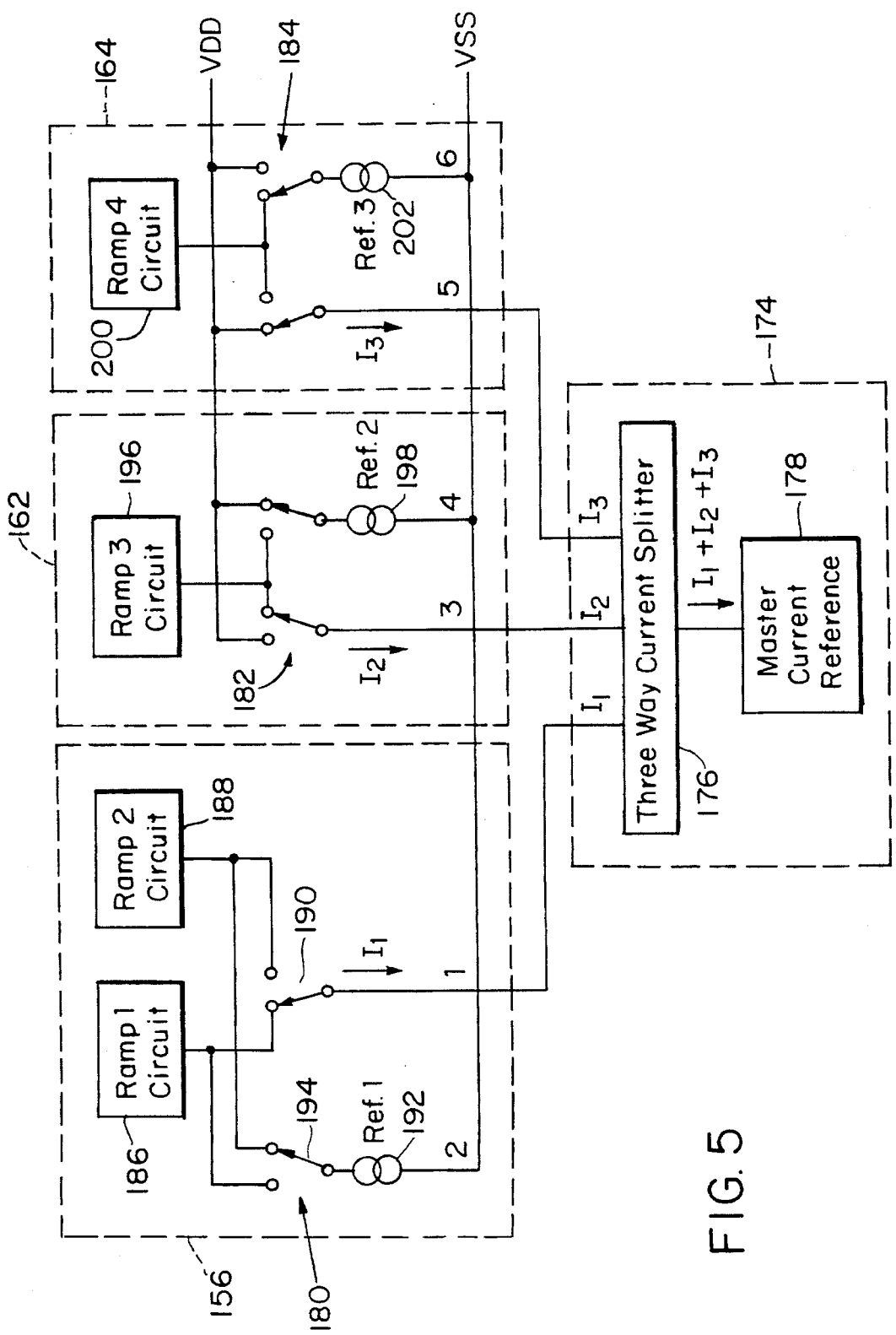
FIG. 5 is a more detailed schematic diagram of the slew rate compensator circuit of FIG. 4.

In order to reduce the number of current sources that have to be matched to provide accurate operation such as occurs when the system is operated over a wide range of frequencies, the same current source is used to provide the current for on-time ramp portion 22 of ramp 16 and on-time ramp portion 34 of ramp 30. Thus the same current source provides the current $I_1$ during on-time 22 and provides an equal current $I_1$ during on-time 34 as explained more fully hereinafter with respect to FIG. 5. While that current source is providing current $I_1$ during on-time 22, a separate current source provides current Ref 1, 192, FIG. 5, to ramp 2 during off-time 28. Similarly, when the current source is providing $I_1$ to ramp 2 during on-time 34, the current Ref 1 is being provided to ramp 1 during off-time 18. Since this switching naturally causes peculiarities at the transition points 110, 66, FIG. 2C, points 114, 68, FIG. 2D, similar transition peculiarities are required in ramp 3, 80, and ramp 4, 82, in order that they stay closely matched to ramps 1 and 2, 16 and 30. However, the same current source cannot be used for both on-time ramp portion 90 of ramp 80 FIG. 2F, and on-time ramp portion 92 of ramp 82 FIG. 2G, because these ramps extend beyond the maximum usable range ΔR3, ΔR4 and overlap each other. Thus for at least a portion of the time they must both be supplied with current simultaneously, such as at time 118, FIGS. 2F and 2G. Since the currents $I_2$ and $I_3$ supplied during on times 90 and 92 can be switched, the off time currents Ref 2 and Ref 3 are switched. Thus the current in ramp 80 during off time 88 is current Ref 2, and then at point 120 the current $I_2$ is provided for on time 90. Similarly, with respect to ramp 4, 82, the on time current 92 ends at point 122 and the current Ref 3 is switched in during off time 94. This not only creates the same transition peculiarities so that ramps 3 and 4, 80 and 82, imitate ramps 1 and 2, 16 and 30; but also limits the number of current sources which must be matched over a wide current range such as caused by operation over a wide frequency range. In this particular embodiment only three such matched current sources are needed, although twelve current sources may be used in all.

Figure 3:
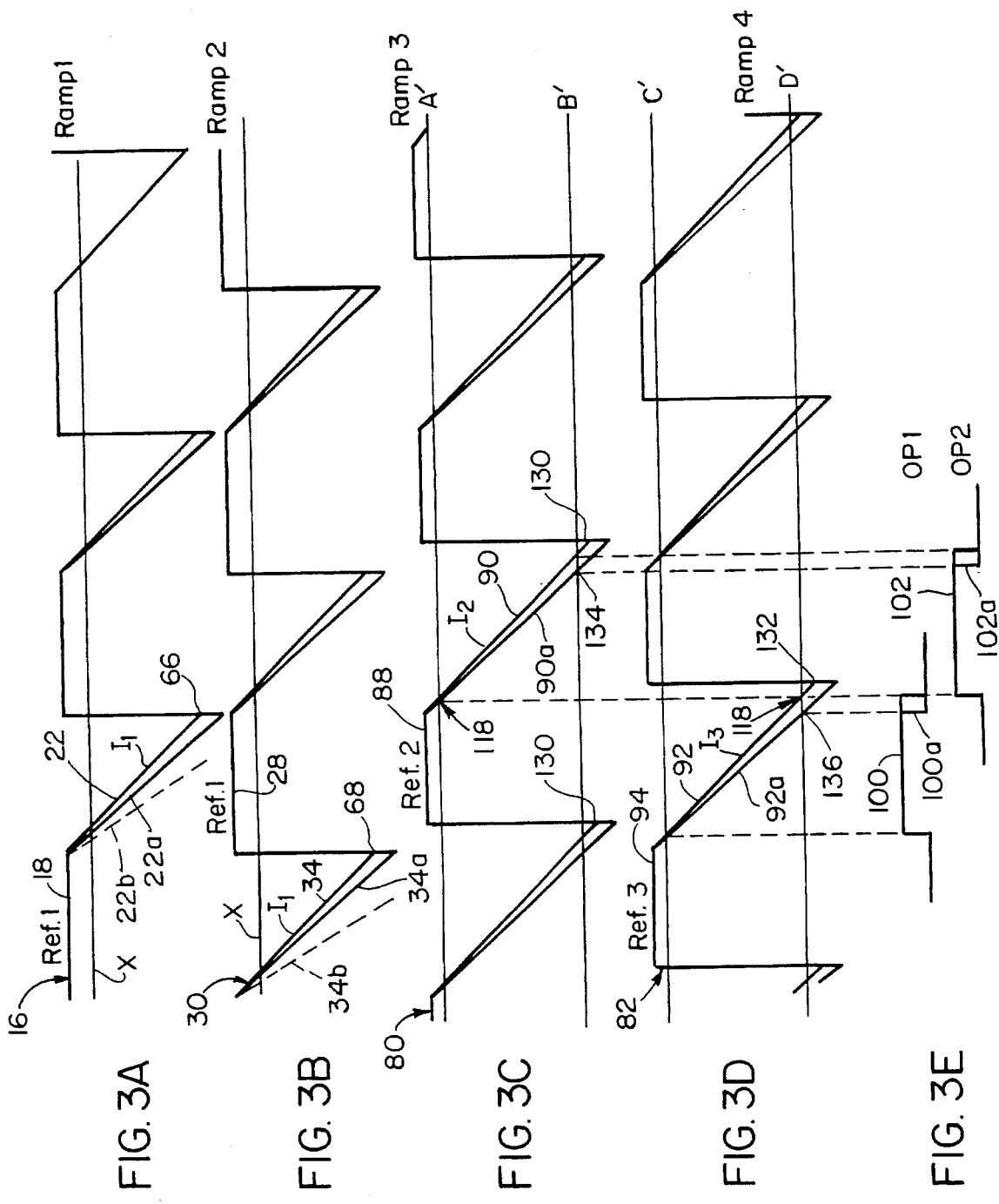

If an error occurs in ramps 1 and 2, 16 and 30, respectively, FIGS. 3A and 3B, because the on time or ramp portion 22a is steeper and therefore overshoots point 66 and ramp portion 34a, FIG. 3B, is too steep and overshoots point 68, then a correction must be effected for ramps 3 and 4, 80 and 82, respectively, FIGS. 3C and 3D. For ramp portion 90a, FIG. 3C, and ramp portion 92a, FIG. 3D, will also be too steep and overshoot their respective normal terminations 130, 132, thus causing the crossing point to move in to points 134 and 136.

To correct this, some of current $I_3$ and some of current $I_2$ is shifted from supplying ramp portions 90 and 92 to supply ramp portions 22 and 34. This increases the slope of ramps 22 and 34 with respect to ramps 90 and 92, so that ramps 22a and 34a will be even steeper, for example as indicated at 22b and 34b. However, when the system is recalibrated the slope portion will return to 22a and 34a while the slopes 90a and 92a will return to slopes 90 and 92. The calibration technique is explained fully in U.S. Pat. No. 5,283,515, "Automatic Calibration System for a Ramp Voltage Generator", issued Feb. 1, 1994, Edward Perry Jordan. Without this correction pulse 100 would be foreshortened as indicated at 100a and pulse 102 would be foreshortened as shown in 102a. But by shifting the currents, the full length of pulses 100 and 102 can be achieved. At times it may be desirable to intentionally increase the slope of ramp portions 22 and 34 so that the ramp portions 90 and 92 can be driven farther to the right as shown in FIGS. 3C and 3D in order to lengthen the pulses 100 and 102 so that they are not just contiguous but actually overlap a bit.

Figure 4:
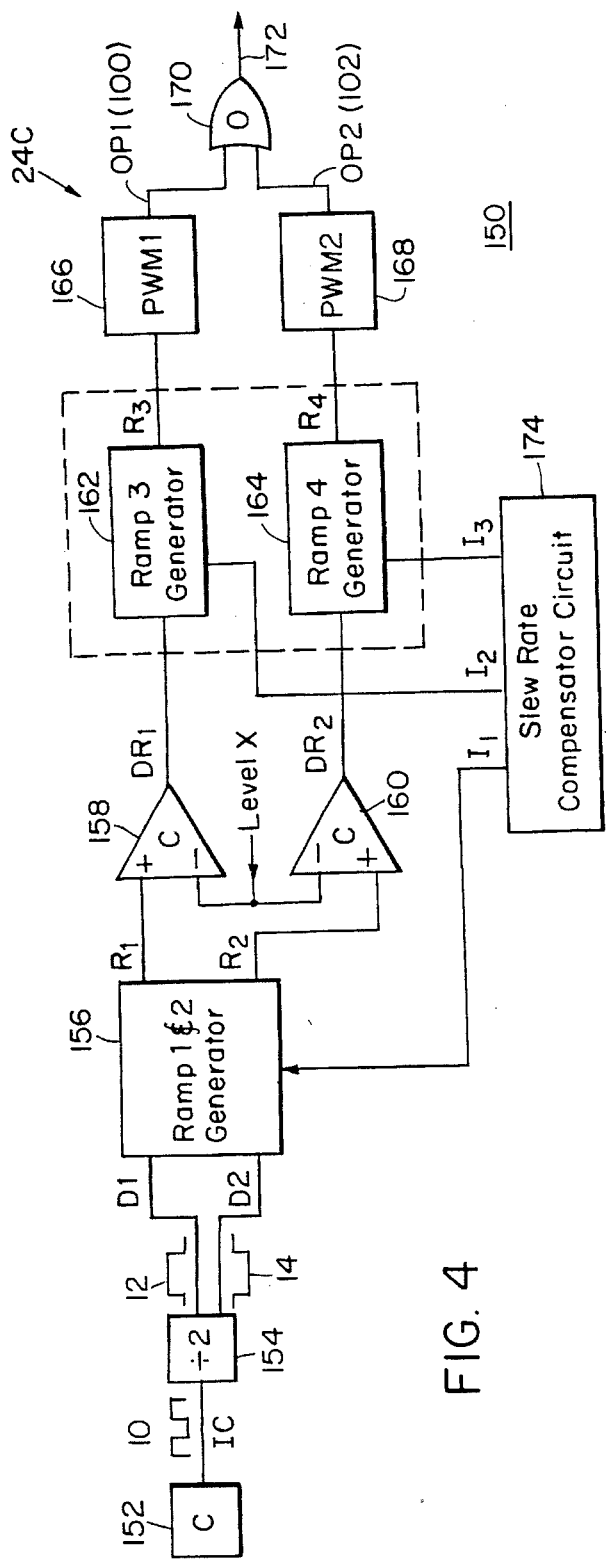
FIG. 4 is a schematic block diagram of an asymmetrical ramp generator system for a pulse width modulator according to this invention.

An asymmetrical ramp generator system for a pulse width modulator 150, FIG. 4, according to this invention, includes an input clock circuit 152 which provides clock signal 10 to divide by two circuit 154 which generates clock signals 12 and 14, D1 and D2. Signals D1 and D2 are submitted to ramp generator 156 which generates ramps 1 and 2 16 and 30. Ramps R1 and R2 are provided to the positive inputs of comparators 158 and 160, respectively. The negative input of those comparators receives reference level X 60, as explained on pages 9 and 10 with respect to FIGS. 2C and 2D. The output from comparators 158 and 160, intermediate drive signals DR1 and DR2, 62 and 64, FIG. 2E, are delivered to ramp generators 162 and 164, which generate ramps $R_3$ and $R_4$, 80 and 82, FIGS. 2F and 2G. The ramp signals, 80 and 82, R3 and R4, are submitted to pulse width modulation circuits 166 and 168 (as disclosed in U.S. Pat. No. 5,295,158, "Dynamically Selectable Multimode Pulse Width Modulation System", issued Mar. 15, 1994, by Edward Perry Jordan) where they are compared with levels A', B' FIG. 2F, and C', D' FIG. 2G, respectively.

The outputs from pulse width modulators 166 and 168, OP1 pulse 100, and OP2, pulse, 102, are or'd in OR gate 170 to produce a final sequence of pulse width modulated pulses at output 172.

Figure 6:
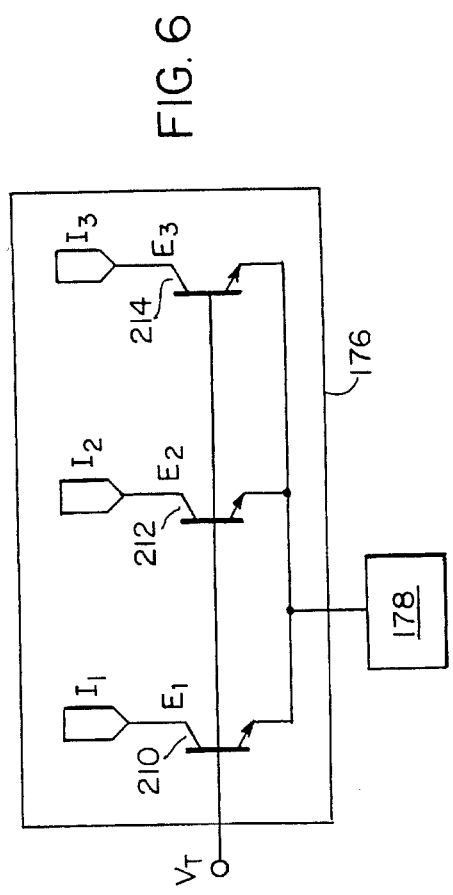
FIG. 6 is a more detailed schematic of the three-way current splitter of FIG. 5.

Slew rate compensator 174 provides currents $I_1$, $I_2$ and $I_3$ to ramp 1 and 2 generator 156 and to ramp 3 generator 162 and ramp 4 generator 164. By shifting portions of current between $I_1$ and $I_2$ and $I_3$ the correction effected in FIGS. 3A–3E is accomplished. Slew rate compensator circuit 174 includes a three-way current splitter 176 and a master current reference 178, FIG. 5. The switching of the current $I_1$ between on time ramp portions 22 and 34, FIGS. 2C and 2D, and the switching of the currents $I_2$, Ref 2, $I_3$ and Ref 3 explained with reference to FIGS. 2F and 2G, is accomplished by the switching mechanisms 180, 182 and 184, FIG. 5. Switching mechanism 180 is included in ramp 1 and 2 generator 156 along with ramp 1 circuit 186 and ramp 2 circuit 188. In one position of the switches, as shown, $I_1$ is supplied to the ramp 1 circuit 186 through switch 190, and Ref 1 current from source 192 is supplied to ramp 2 circuit 188 through switch 194. In the other position switch 190 provides $I_1$ to ramp 2 circuit 188 and switch 194 provides Ref 1 current to ramp 1 circuit 186. Switching circuit 182 included with ramp 3 circuit 196 in ramp 3 generator 162 provides current $I_2$ to ramp 3 circuit 196 in one position, and in the other position provides Ref 2 current from source 198 to ramp 3 circuit 196. Switch 184 included in ramp 4 generator 164 along with ramp 4 circuit 200 provides current Ref 3 from source 202 to ramp 4 circuit 200 and in the other position provides current $I_3$ to ramp 4 circuit 200. The sharing of the current as explained with reference to FIGS. 3A–3E is accomplished by three-way current splitter 176 as shown in more detail in FIG. 6, where it is illustrated as including three transistors 210, 212 and 214 having emitter areas $E_1$, $E_2$ and $E_2$. The emitter areas of transistors 212 and 214 are equal. The size of the emitter area $E_1$ relative to the size of the areas $E_2$, may be greater, equal or less, depending upon whether it is desired to correct an overshoot, ideal conditions exist, or it is desired to increase or decrease the slope of the ramp portions 90 and 92 of ramps 3 and 4. The implementation in FIG. 6 is but one of a number of approaches which can be used. For example, resistor degeneration could be used by inserting resistors in the emitter circuits of each of the transistors 210, 212 and 214. The resistors could be trimmed, ratios could be changed, FETs could be used in place of bipolars, for example.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. An asymmetrical ramp generator system for a pulse width modulator, comprising:
   a complementary clock circuit;
   a first symmetrical dual ramp generator, responsive to said clock circuit, for generating first and second ramps having a predetermined voltage range and extending for a period equal to or greater than one half the clock cycle;
   a comparator device, responsive to each of said first and second symmetrical ramps and to a reference level within said predetermined voltage range of said first and second ramps, for generating corresponding dual first and second asymmetrical drive signals; and
   a second asymmetrical dual ramp generator, responsive to said first and second asymmetrical drive signals, for generating third and fourth asymmetrical overlapping ramps which extend beyond said predetermined voltage range.

2. The asymmetrical ramp generator system of claim 1 further including a pulse width modulator responsive to said third and fourth asymmetrical overlapping ramps for generating corresponding first and second pulses.

3. The asymmetrical ramp generator system of claim 1 further including a pulse width modulator responsive to said third and fourth asymmetrical overlapping ramps for generating corresponding first and second contiguous pulses.

4. The asymmetrical ramp generator system of claim 1 in which said complementary clock circuit includes a clock and a divide by two circuit for providing dual symmetrical complementary fifty percent duty cycle clock pulses.

5. The asymmetrical ramp generator system of claim 1 in which said comparator device includes first and second comparators each of which receives at one of its inputs one of said first and second symmetrical ramps, and receives at the other of its inputs said reference level.

6. The asymmetrical ramp generator system of claim 1 in which said first symmetrical dual ramp generator includes first and second ramp generators, a first current source for supplying a first current to set the slew rate of the active one of said first and second ramps and a second current source for supplying a second current to set the upper level of the inactive one of said first and second ramps and first switching means for alternately, selectively, interchanging said first and second current sources between said first and second ramp generators.

7. The asymmetrical ramp generator system of claim 1 in which said second asymmetrical dual ramp generator includes third and fourth ramp generators, a third current source for supplying a third current to set the slew rate of said third ramp, a fourth current source for supplying a fourth current to set the upper level of said third ramp, a fifth current source for supplying a fifth current to set the slew rate of said fourth ramp, a sixth current source for supplying a sixth current to set the upper level of said fourth ramp, and second switching means for alternately, selectively, connecting said third and sixth current sources to one of said third and fourth ramp generators and said fourth and fifth current sources to other of said third and fourth ramp generators.

8. The asymmetrical ramp generator system of claim 7 in which said first, third and fifth currents are equal.

9. The asymmetrical ramp generator system of claim 7 in which said fourth and sixth currents are equal.

10. The asymmetrical ramp generator system of claim 7 in which said second, fourth and sixth currents are equal.

11. The asymmetrical ramp generator system of claim 7 including a slew rate compensator circuit, responsive to said first and second ramps exceeding said predetermined voltage range, for decreasing the slew rate of said third and fourth ramps relative to the slew rates of said first and second ramps.

12. The asymmetrical ramp generator system of claim 11 in which said slew rate compensator circuit includes a current splitting circuit for controlling the ratio of said first, third and fifth currents.

* * * * *